(12) United States Patent
Chen

(10) Patent No.: US 8,767,471 B2
(45) Date of Patent: *Jul. 1, 2014

(54) SYSTEMS AND METHODS FOR AUTO-CALIBRATION OF A STORAGE MEMORY CONTROLLER

(71) Applicant: STEC, Inc., Santa Ana, CA (US)

(72) Inventor: Tsan L. Chen, Zhubei (TW)

(73) Assignee: STEC, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/752,823

(22) Filed: Jan. 29, 2013

(65) Prior Publication Data

US 2013/0194873 A1    Aug. 1, 2013

Related U.S. Application Data

(63) Continuation of application No. 13/420,849, filed on Mar. 15, 2012, now Pat. No. 8,379,457.

(60) Provisional application No. 61/590,893, filed on Jan. 26, 2012.

(51) Int. Cl.
*G11C 11/34* (2006.01)

(52) U.S. Cl.
USPC .......... 365/185.18; 365/185.33; 365/189.011; 365/189.15; 365/189.05; 365/189.07; 365/189.08; 365/193; 365/194

(58) Field of Classification Search
USPC .......... 365/185.18, 185.33, 189.011, 189.15, 365/189.05, 189.07, 189.08, 193, 194, 365/185.23
See application file for complete search history.

(56) References Cited

U.S. PATENT DOCUMENTS

| | | | |
|---|---|---|---|
| 6,401,123 B1 | 6/2002 | Shields et al. | |
| 6,401,213 B1 * | 6/2002 | Jeddeloh | 713/401 |
| 6,785,793 B2 | 8/2004 | Aboulenein et al. | |
| 7,123,051 B1 * | 10/2006 | Lee et al. | 326/40 |
| 7,290,160 B2 | 10/2007 | Walker | |
| 7,307,900 B2 | 12/2007 | Salmon et al. | |
| 7,372,293 B2 | 5/2008 | Cox et al. | |
| 7,432,731 B2 | 10/2008 | Bains et al. | |
| 7,499,369 B2 * | 3/2009 | Lin | 365/233.1 |
| 8,379,457 B1 | 2/2013 | Chen | |
| 2012/0081973 A1 | 4/2012 | Kishimoto et al. | |

OTHER PUBLICATIONS

No Author Listed. JEDEC Standard. DDR3 SDRAM Standard. JESD79-3D. JEDEC Solid State Technology Association. Sep. 2009. 220 pages.

* cited by examiner

*Primary Examiner* — Fernando Hidalgo
(74) *Attorney, Agent, or Firm* — Wilmer Cutler Pickering Hale and Dorr LLP

(57) ABSTRACT

Systems and methods for auto-calibrating a storage memory controller are disclosed. In some embodiments, the systems and methods may be realized as a method for auto-calibrating a storage memory controller including instructing a controllable delay circuit to delay a read strobe signal at one of a plurality of delay settings, receiving data captured at a data latch using the delayed read strobe signal, selecting an adjustment factor from the plurality of delay settings using a multi-scale approach, based on an accuracy of the data captured at the data latch, and instructing the controllable delay circuit to delay the read strobe signal by the adjustment factor.

20 Claims, 8 Drawing Sheets

SYSTEMS AND METHODS FOR AUTO-CALIBRATION OF A STORAGE MEMORY CONTROLLER

CROSS-REFERENCE TO RELATED APPLICATION

This application is a continuation application of, and claims the benefit of the earlier priority date of, the U.S. patent application Ser. No. 13/420,849, entitled "AUTO CALIBRATION OF STORAGE MEMORY CONTROLLER," filed on Mar. 15, 2012, which claims the benefit of the U.S. Provisional Patent Application No. 61/590,893, entitled "AUTO CALIBRATION OF STORAGE MEMORY CONTROLLER," filed on Jan. 26, 2012. The above-identified applications are hereby expressly incorporated by reference herein in their entireties.

TECHNICAL FIELD

The disclosed subject matter relates generally to systems and methods for calibrating storage memory controllers.

BACKGROUND

Improvements in read interfaces on flash memory controllers are increasing the speed at which a flash memory controller can read data. However, variations in process, voltage, and temperature (PVT) of flash devices, NAND flash controllers and printed circuit boards (PCBs) make data capture increasingly unreliable as interface speed, or bandwidth, increases. As read and write strobe frequencies increase, PVT variations will increasingly affect flash memory reliability.

SUMMARY

Certain embodiments of the present disclosure relates to a flash memory controller. The flash memory controller includes a controllable delay circuit configured to receive a read strobe signal from a flash memory device and to delay the read strobe signal, a data latch, coupled to the controllable delay circuit, configured to receive the delayed read strobe signal, and to capture data from the flash memory device using the delayed read strobe signal, and a calibration circuit coupled to the controllable delay circuit, configured to instruct the controllable delay circuit to delay the read strobe signal at one of a plurality of delay settings, receive the captured data from the data latch, select an adjustment factor based on an accuracy of the captured data, and instruct the controllable delay circuit to delay the read strobe signal by the adjustment factor so that the data latch captures sufficient accurate data during subsequent memory read operations.

Certain embodiments of the present disclosure relates to logic encoded on one or more non-transitory media for execution. The logic can be operable to instruct a controllable delay circuit to delay a read strobe signal received from a flash memory device at one of a plurality of delay settings, receive data captured at a data latch, coupled to the controllable delay circuit, using the read strobe signal delayed at the one of the plurality of delay settings, select an adjustment factor from the plurality of delay settings using a multi-scale approach, based on an accuracy of the data captured at the data latch, and instruct the controllable delay circuit to delay the read strobe signal by the adjustment factor so that the data latch captures sufficiently accurate data during subsequent memory read operations.

Certain embodiments of the present disclosure relates to a method that includes instructing a controllable delay circuit to delay a read strobe signal, received from a flash memory device, at one of a plurality of delay settings, selecting an adjustment factor from the plurality of delay settings using a multi-scale approach, based on an accuracy of the data captured at the data latch, and instructing the controllable delay circuit to delay the read strobe signal by the adjustment factor so that the data latch captures sufficiently accurate data during subsequent memory read operations.

BRIEF DESCRIPTION OF THE FIGURES

Various objects, features, and advantages of the disclosed subject matter can be more fully appreciated with reference to the following detailed description when considered in connection with the following drawings, in which like reference numerals identify like elements. The following drawings are for the purpose of illustration only and are not intended to be limiting.

DETAILED DESCRIPTION

The disclosed subject matter relates to systems and methods for accommodating variations in a memory system. In particular, disclosed systems and methods can address variations in either the flash memory itself (e.g., process variations in how the flash memory was made) or the operating conditions of the flash memory (e.g., the temperature of the flash memory or voltage of an attached power supply). The disclosed systems include an auto calibration circuit that can compensate for process, voltage and/or temperature (PVT) and reduce errors from accessing NAND flash memory ("N-flash"). This auto calibration feature can improve N-flash life cycle and reliability.

Disclosed systems and methods can address the path delay variations due to PVT variations. In particular, disclosed systems and methods can compensate for path delay variations between memory and a memory controller. In a typical memory system, a memory controller is configured to read data from memory by sending a memory read request to the memory. In response to the memory read request, the memory is configured to send the requested data and a read strobe signal to the memory controller. The memory controller uses the read strobe signal to identify the time at which the requested data arrives at the memory controller and uses the read strobe signal to latch the requested data. Unfortunately, the path delay variations between the memory and the memory controller can advance or delay the read strobe signal with respect to the arrival of the requested data, which reduces the reliability of the memory read operations. Disclosed systems and methods can address the path delay variations by adaptively adjusting the delay of the read strobe signal with respect to arrival of the requested data to compensate for path delay variations. This path delay adaptation can be performed using an auto calibration circuit and a controllable delay circuit. The auto calibration circuit includes an adaptive delay identification mechanism for identifying an adaptive delay of the read strobe signal to enable a stable memory read operation, and further includes a control mechanism for controlling the delay of the controllable delay circuit. The auto calibration circuit can be configured to identify the adaptive delay of the read strobe signal with a desired accuracy. Furthermore, the auto calibration circuit can identify the adaptive delay of the read strobe signal in a multiscale manner to reduce the calibration time.

Figure 1:
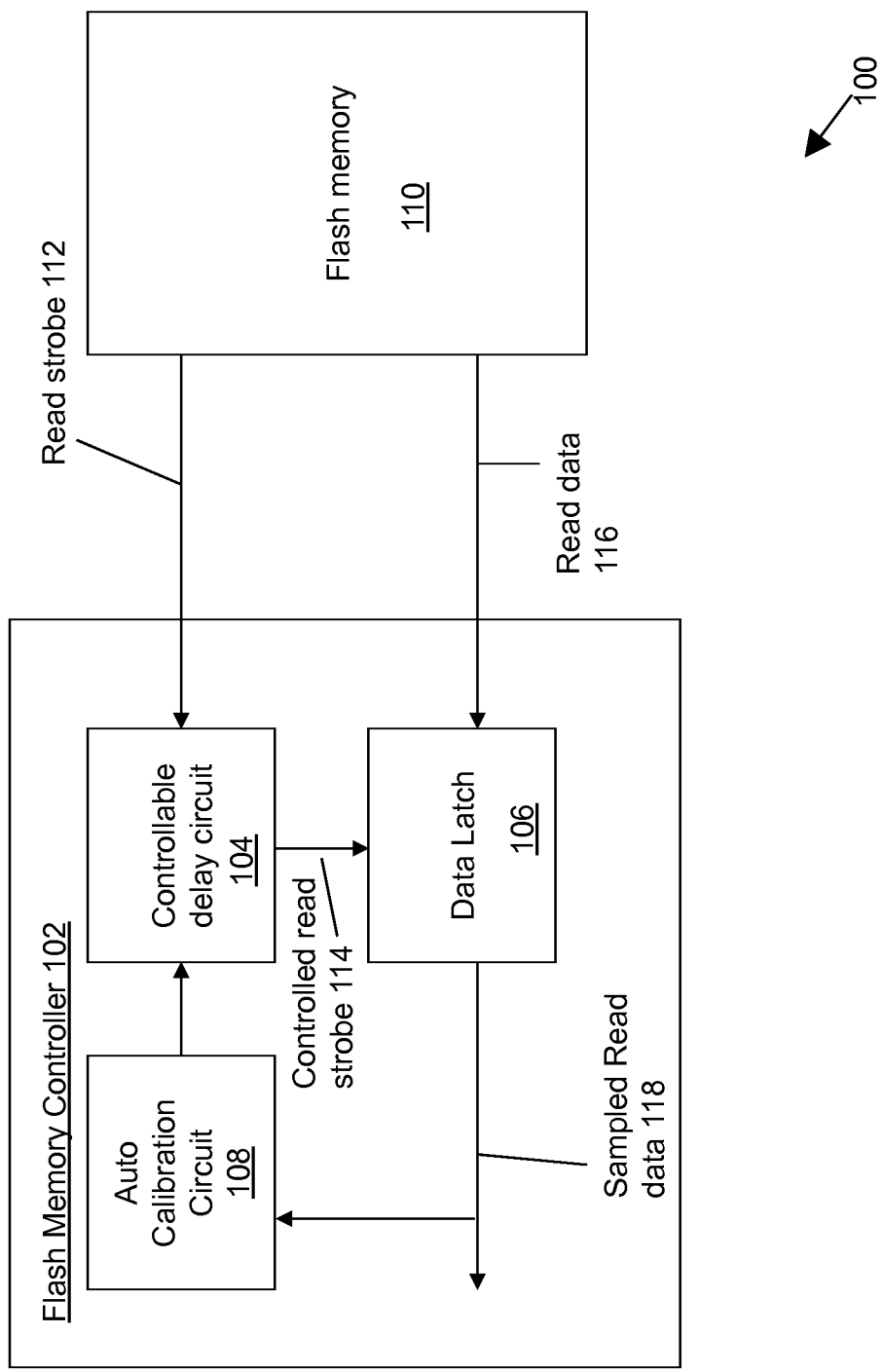
FIG. 1 illustrates a flash memory device having an auto calibration circuit.

FIG. 1 illustrates a flash memory device 100 according to embodiments of the disclosed subject matter. FIG. 1 includes a flash memory controller 102 and a flash memory 110. Flash memory 110 can be any type of flash memory, for example N-Flash, and can include a plurality of N-Flash devices connected in series or parallel. Flash memory controller 102 includes a controllable delay circuit 104, a data latch 106, and an auto calibration circuit 108. The above devices communicate by sending and receiving a number of signals, including a read strobe signal 112, a controlled read strobe signal 114, a read data signal 116, and a reliable read data signal 118.

In response to a memory read request from flash controller 102 to read data, flash memory 110 provides read strobe signal 112 and read data signal 116 to the flash memory controller 102. Read data signal 116 represents the data stored in flash memory 110; Read strobe signal 112 represents a timing signal, indicating when data latch 106 can sample the read data signal 116.

In certain embodiments, in response to a memory read request, flash memory 110 can provide read strobe signal 112 and read data signal 116 to the flash memory controller 102 periodically. For example, in a burst mode memory read scenario, flash memory 110 would retrieve stored data at a fixed frequency (i.e., periodically). Therefore, flash memory 110 would send read strobe signal 112 to the memory controller 102 periodically.

Flash memory controller 102 can use the read strobe signal 112 to determine when to sample the read data signal 116 at the data latch 106. Data latch 106 uses a strobe signal to determine when to sample the read data signal 116. In certain embodiments, data latch 106 is a conventional latch, sampling the input data on the rising edge and/or the falling edge of the controlled read strobe signal 114.

The timing of the strobe signal with respect to the read data signal 116 is important for the data latch 106 to sample a reliable read data signal 116. If the read strobe signal 112 arrives before the read data signal 116 arrives at the input of the data latch 106, the data latch 106 may latch an incorrect data signal (i.e., a data signal for the previous read cycle). On the other hand, if the read strobe signal 112 arrives well after the read data signal 116 arrives at data latch 106, the data throughput (i.e., the speed of the read operation) of the flash memory would be severely reduced. Furthermore, if the flash memory 110 is operating in a burst mode and if the read strobe signal arrives too late at data latch 106, data latch 106 could in fact sample the read data signal for the next burst cycle (i.e., read data signal from a different address). Therefore, it's important to design the memory system so that the read strobe signal 112 arrives at the data latch 106 after the read data signal arrives at the input of the data latch 106, but early enough to improve the memory operation speed and accuracy.

Figure 2:
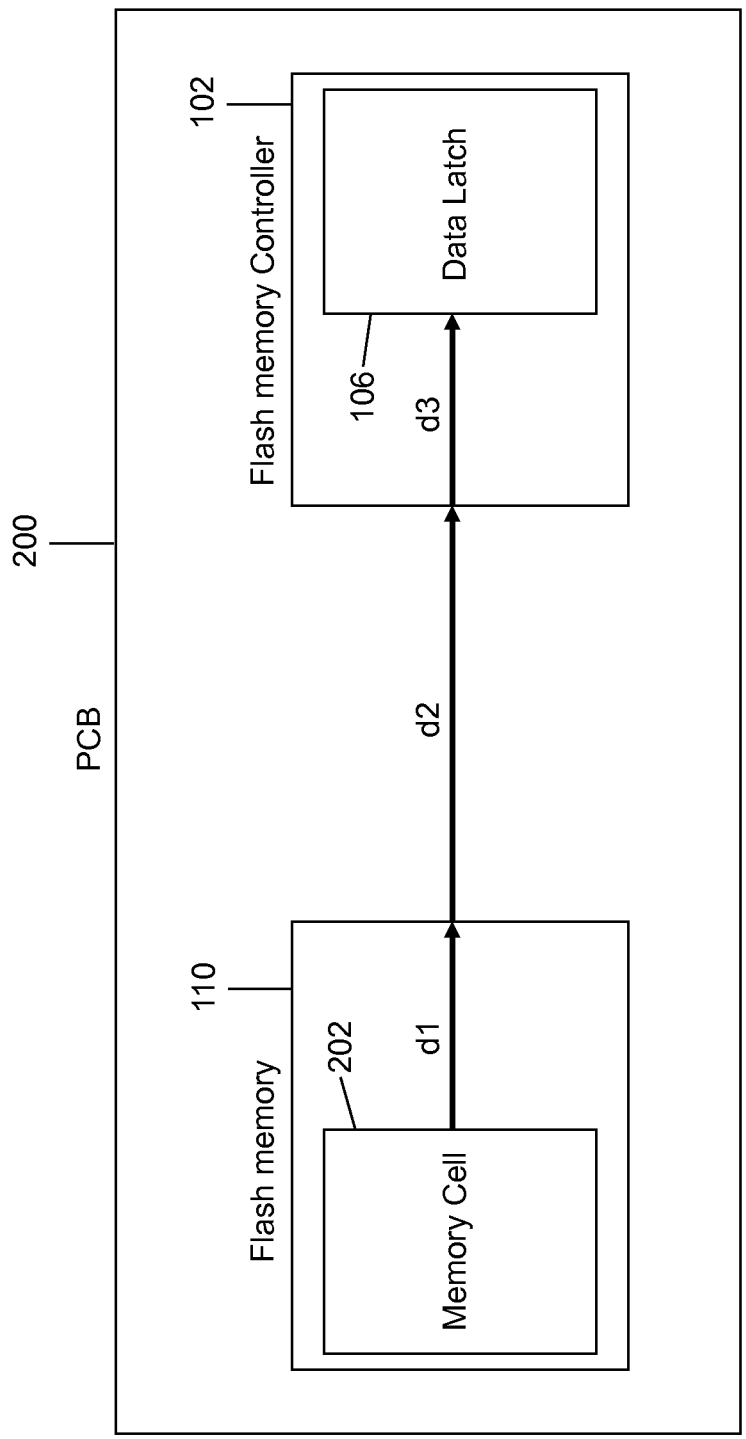
FIG. 2 shows a controllable delay circuit.

One factor that affects the timing of the read strobe signal 112 with respect to the read data signal is the signal path between a memory cell and a flash memory controller. FIG. 2 illustrates a signal path between a memory cell and a flash memory controller in accordance with some embodiments. To reach the data latch 106, the read strobe signal travels through the flash memory 110, the PCB 200, and the flash memory controller 102. Therefore, the path delay of the read strobe signal includes (1) the path delay within the flash memory 110, denoted as "d1," (2) the path delay in the PCB 200, denoted as "d2," and (3) the path delay within the flash memory controller 102, denoted as "d3." In sum, the path delay of a read strobe signal from the memory cell to the data latch can be denoted as "d1+d2+d3." Likewise, the path delay of a read data signal includes (1) the path delay within the flash memory 110, denoted as "d1'", (2) the path delay in the PCB 200, denoted as "d2'", and (3) the path delay within the flash memory controller 102, denoted as "d3'". In sum, the path delay of a read data signal from the memory cell to the data latch can be denoted as "d1'+d2'+d3'." Therefore, one could design the signal path for the read strobe signal appropriately so that the read strobe signal 112 arrives at the data latch 106 at an appropriate time with respect to the read data signal.

Unfortunately, there are additional factors that may affect the path delay of the read strobe signal, and it's challenging to predict the effects of these factors when designing the system. These factors can include process variations, temperature variations, and voltage fluctuations. Process variations include variations in the device fabrication process. Process variations can undesirably and/or randomly alter the physical attributes of fabricated semiconductor devices, such as flash memory, and PCBs. For example, when compared to the original design of a flash memory cell, transistors in a fabricated flash memory cell can have different physical attributes such as lengths, widths, oxide thickness, and doping profiles. Therefore, process variations can cause two flash memory cells with identical design to exhibit different operating characteristics, such as speed, read stability, and write stability. This can affect the path delay within the flash memory 110 and the path delay within the flash memory controller 102. Likewise, fabricated PCBs can have different physical attributes compared to its design. Therefore, the actual path delay of the PCB 200 can be different from the designed path delay of the PCB.

Temperature variations include to variations in the flash memory's operating temperature. Temperature variations can alter the operating characteristics of transistors in flash memory. For example, in response to temperature variations, the threshold voltage of transistors can change, which in turn would affect the path delay of the read strobe signal. Because temperature variations depend upon the activity of the device, temperature variations are hard to predict at design time. Voltage fluctuations can include voltage variations of a connected power supply. Transistors are designed to operate faster when provided with a higher voltage. Therefore, as the voltage from the power supply fluctuates, the operating speed of the transistors also can fluctuate, affecting the path delay of the read strobe signal. Because voltage variations depend upon the activity of the power supply and/or the real-time operation of the power supply, voltage variations are difficult to predict at design time.

To address challenges associated with PVT variations, disclosed systems and methods use auto calibration circuit 108. Auto calibration circuit 108 takes into account these factors to calibrate the path delay of the read strobe signal 116 so that the read strobe signal 116 arrives at the data latch 106 at an appropriate time. To this end, auto calibration circuit 108 is configured to determine an adjustment factor to be applied to the read strobe signal. The adjustment factor can include an adjustment of either or both of the phase (i.e., delay) and periodicity (i.e., frequency) of the read strobe signal 112 so that the data latch 106 samples the correct read data signal. Auto calibration circuit 108 can be implemented in hardware and can be controlled by hardware, firmware or both.

Once auto calibration circuit 108 determines the adjustment factor, auto calibration circuit 108 can send the adjustment factor to controllable delay circuit 104. Controllable delay circuit 104, which can be embedded in either the flash controller or the solid state device, is configured to generate a delayed version of the read strobe signal 112. Based on the adjustment factor received from auto calibration circuit 108, controllable delay circuit 104 can modify the phase and/or periodicity of read strobe signal 112 to create controlled read strobe signal 114, which is subsequently provided to data latch 106. Data latch 106 then can use controlled read strobe signal 114 to sample the read data signal 116.

Figure 3:
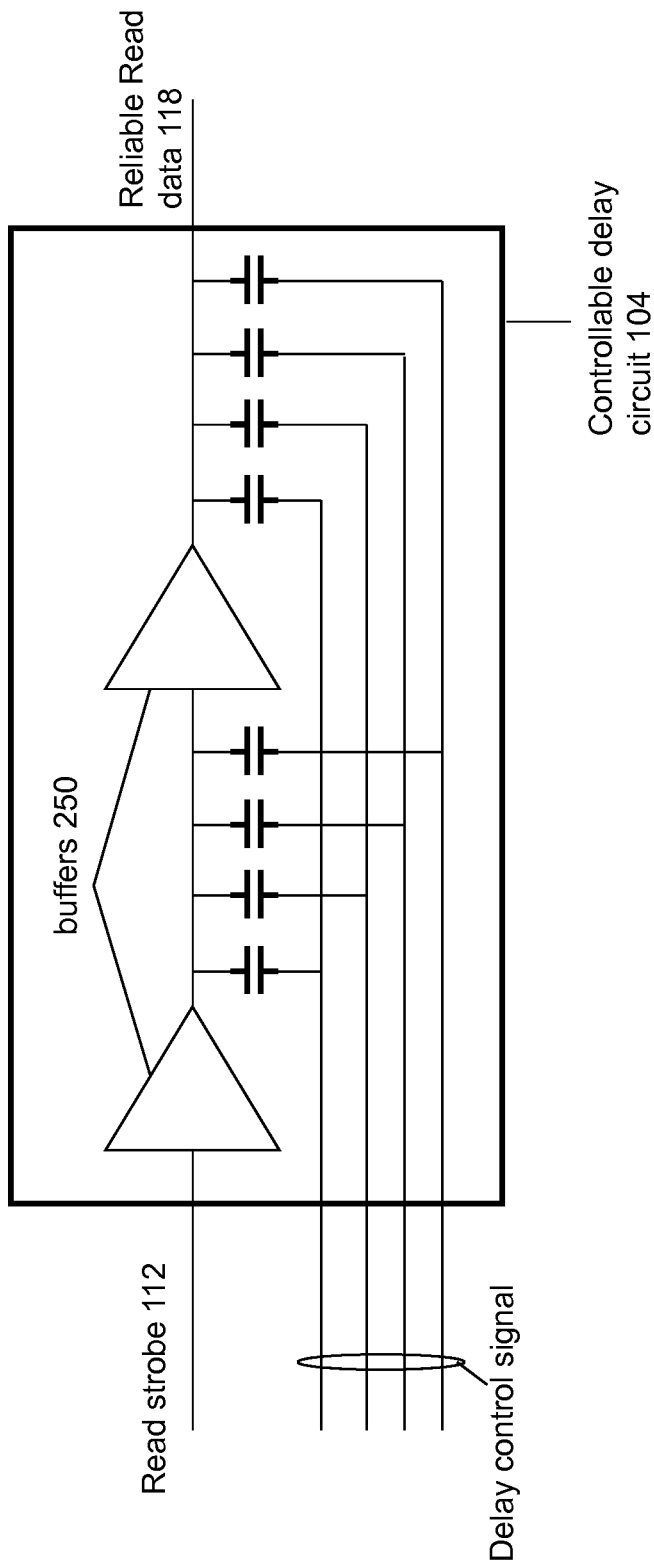
FIG. 3 illustrates a path delay of a read strobe signal, from the memory cell to the flash memory controller.

In some embodiments, controllable delay circuit 104 can include a programmable delay line, as illustrated in FIG. 3. The programmable delay line can include a plurality of buffers 250 coupled to each other in a chain configuration. The programmable delay line can also include a capacitor bank between buffers to control the path delay from the input of controllable delay circuit 104 to the output of controllable delay circuit 104. The capacitance of the capacitor bank can be programmed using a delay control signal. In certain embodiments, controllable delay circuit 104 can receive the delay control signal from auto calibration circuit 108.

As discussed above, auto calibration circuit 108 can determine the adjustment factor for the controllable delay circuit. At a high level, auto calibration circuit 108 can configure controllable delay circuit 104 to delay the read strobe signal 112 by a predetermined amount and configure data latch 106 to provide the received data sampled using the delayed read strobe signal. Auto calibration circuit 108 can analyze the data received from data latch 106 to determine the reliability of memory operations under the configured delay setting. After performing the above operations for different delay settings, auto calibration circuit 108 can select the adjustment factor based on which delay setting was able to reliably sample the read data signal.

Figure 4:
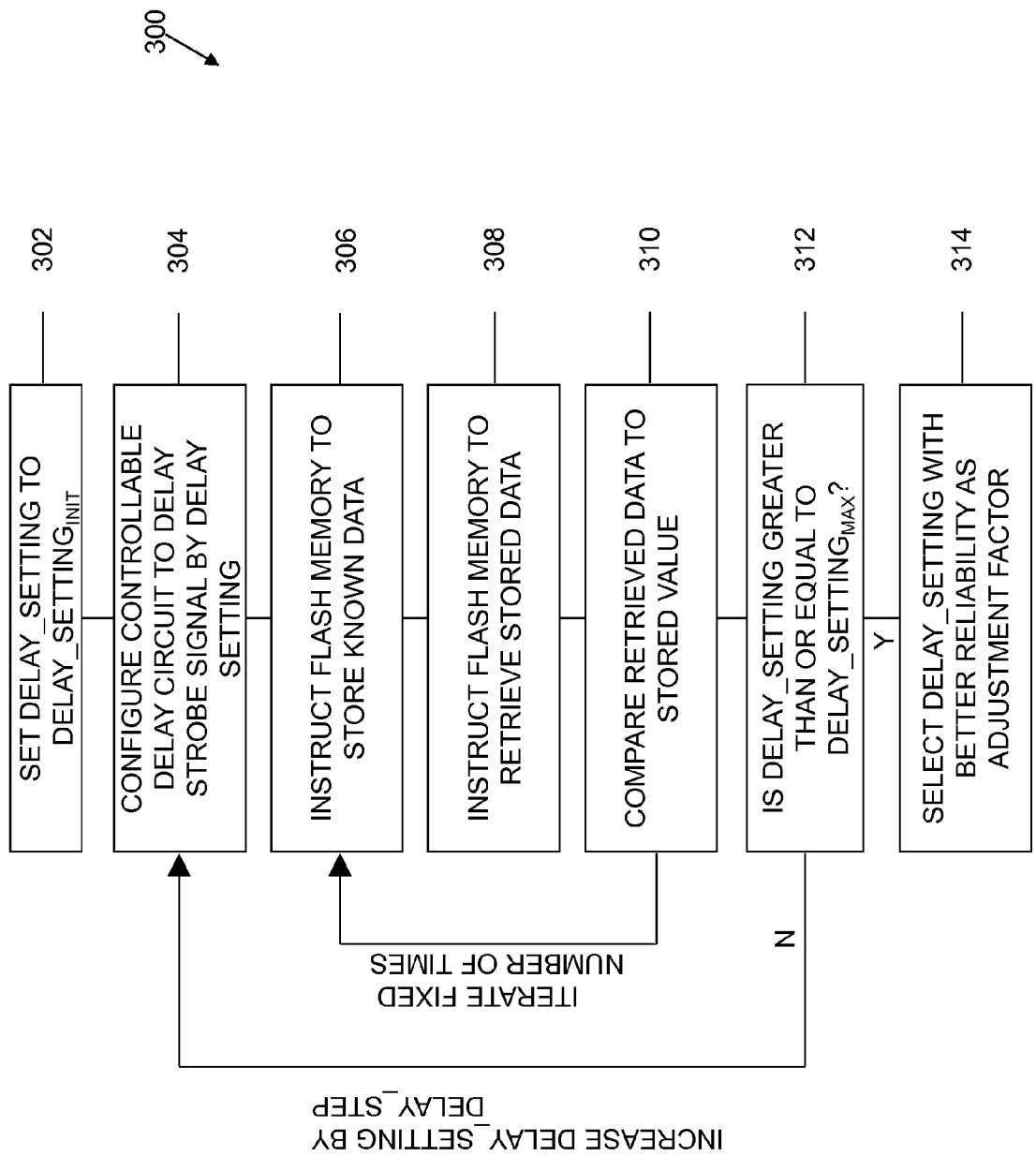
FIG. 4 illustrates a method for determining an adjustment factor for a read strobe signal.

FIG. 4 illustrates a method of determining an adjustment factor in accordance with certain embodiments. In step 302, auto calibration circuit 108 can set the initial delay setting to a predetermined initial value, DELAY_SETTING$_{INIT}$. The delay setting indicates the amount of delay to apply to the read strobe signal. The delay setting can be measured in seconds (i.e., time) or in degrees (i.e., phase). If the delay setting is measured in degrees, the delay setting can be one of the values within the range of 0 and 180 degrees. In step 304, auto calibration circuit 108 configures controllable delay circuit 104 to delay the read strobe signal as indicated by the delay setting. Then, in step 306, auto calibration circuit 108 instructs the flash memory 110 to store known data. In step 308, auto calibration circuit 108 instructs the flash memory 110 to retrieve the stored known data.

In step 310, auto calibration circuit 108 compares the retrieved data to the known data to determine if the retrieved data match the stored data. If the retrieved data matches the stored data, then auto calibration circuit 108 can determine that the particular delay setting can reliably retrieve the stored data. In certain embodiments, steps 306-310 can be performed multiple times to improve the accuracy of the analysis. In some cases, one delay setting can cause the retrieved data to match the stored, known data, but the same delay setting can cause the retrieved data to differ from the stored, known data. This can be due to the random temperature and/or voltage fluctuations. Therefore, auto calibration circuit 108 can perform steps 306-310 multiple times and count the number of times the stored data was correctly retrieved under the particular delay setting. This number, also called a catch rate, can be maintained at auto calibration circuit 108 in a table. This table is also referred to as an auto calibration window. Auto calibration circuit 108 can use auto calibration window to determine the adjustment factor, as described with respect to step 314.

In step 312, auto calibration circuit 108 can check whether the current delay setting is greater than or equal to a threshold. If not, then auto calibration circuit 108 can increase the delay setting by a predetermined increment, DELAY_STEP, and go to step 304. If so, then auto calibration circuit 108 can go to step 314. The predetermined increment, DELAY_STEP, can be a fixed value; the predetermined increment can depend on the value of the delay setting.

In step 314, auto calibration circuit 108 can select one of the tested delay settings as the adjustment factor. In certain embodiments, auto calibration circuit 108 can select the adjustment factor based on selection criteria. In one embodiment, the selection criteria may include a criterion on catch rates. For example, auto calibration circuit 108 can select as an adjustment factor the delay setting at which the catch rate is the highest. In another embodiment, the selection criteria can include a criterion on the value of the delay setting. For example, in some cases, multiple delay settings can have statistically similar catch rates. In such cases, auto calibration circuit 108 can select as the adjustment factor one of the multiple delay settings with the smallest delay value. The criterion on the value of the delay setting can help increase the throughput of the memory read operations.

Figure 5:
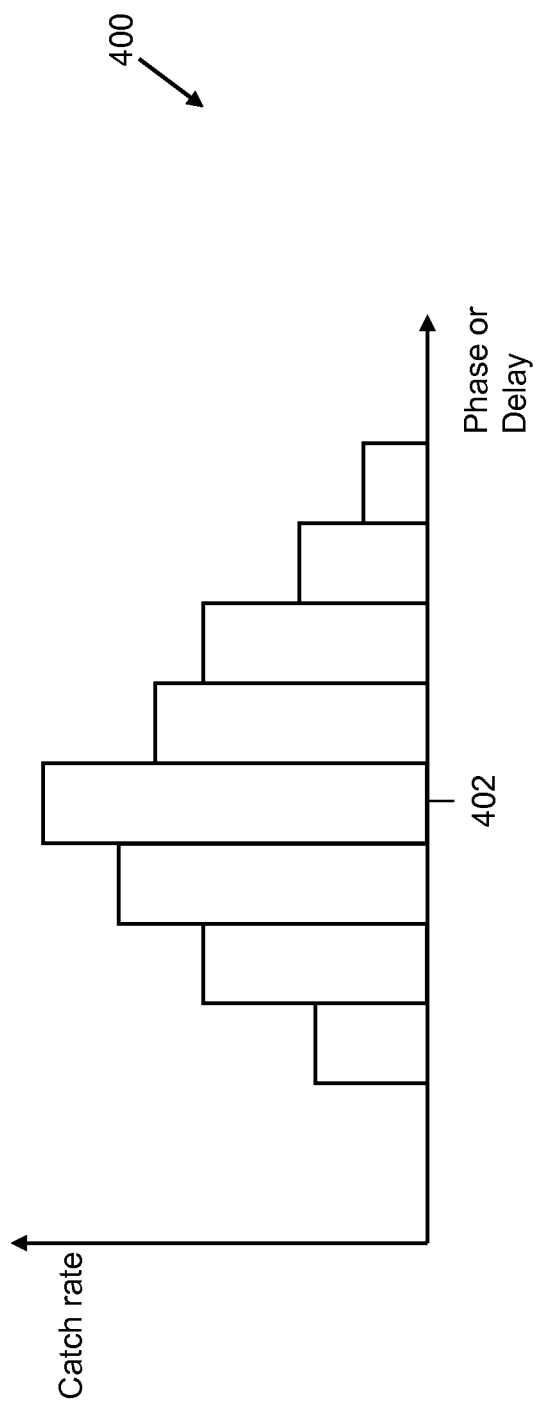
FIG. 5 illustrates an auto calibration window that can be used for determining the phase or delay for a read strobe signal.

In some embodiments, auto calibration circuit 108 can select the adjustment factor using an auto calibration window, which maintains catch rates associated with delay settings. FIG. 5 illustrates auto calibration window 400 in accordance with certain embodiments. Using auto calibration window 400, auto calibration circuit 108 can select the phase 402 as the adjustment factor. In some embodiments, auto calibration window 400 is implemented as hardware. The hardware can include logic circuits and/or memory for maintaining catch rates of one or more delay settings, and can further include logic circuits for determining the adjustment factor based on the maintained catch rates. The hardware can be implemented using a hardware description language including Verilog, VHSIC hardware description language (VHDL), and BlueSpec™ (Bluespec Inc., Framingham, Mass.), and be synthesized using logic synthesis tools including Design Compiler® (Synopsis Inc., Mountain View, Calif.), Encounter RTL compiler (Cadence Design Systems Inc., San Jose, Calif.), RealTime Designer (Oasys Design Systems, Inc., Santa Clara, Calif.), and BooleDozer (International Business Machine, Endicott, N.Y.). In some embodiments, auto calibration window 400 is implemented as a part of firmware. Firmware can allocate a memory space for maintaining auto calibration window 400, and can further include instructions operable to determine the adjustment factor based on the maintained catch rates in auto calibration window 400.

In some embodiments, step 306 of method 300 can be skipped. If flash memory 110 carries a vendor identifier and if the vendor identifier is known to auto calibration circuit 108, auto calibration circuit 108 can use the vendor identifier as the known data stored in flash memory 110. Specifically, when a read ID (vendor identification) command is delivered to the flash memory, a known ID should be provided by the flash memory.

In some embodiments, auto calibration circuit 108 can identify the adjustment factor using a multi-scale, coarse-to-fine mechanism. For example, auto calibration circuit 108 can coarsely identify the adjustment factor by testing delay settings coarsely sampled from a range of interested delay settings, as illustrated in FIG. 4. Once the coarse adjustment factor is determined, auto calibration circuit 108 can fine-tune the coarse adjustment factor by testing fine delay settings that are in the vicinity of the coarse adjustment factor. Fine delay settings in the vicinity of the coarse adjustment factor can include delay settings that are sampled around the coarse adjustment factor. For example, the fine delay settings can be sampled with an interval between the delay settings. The interval between the fine delay setting can be smaller than the interval between the delay settings used to determine the coarse adjustment factor.

Figure 6:
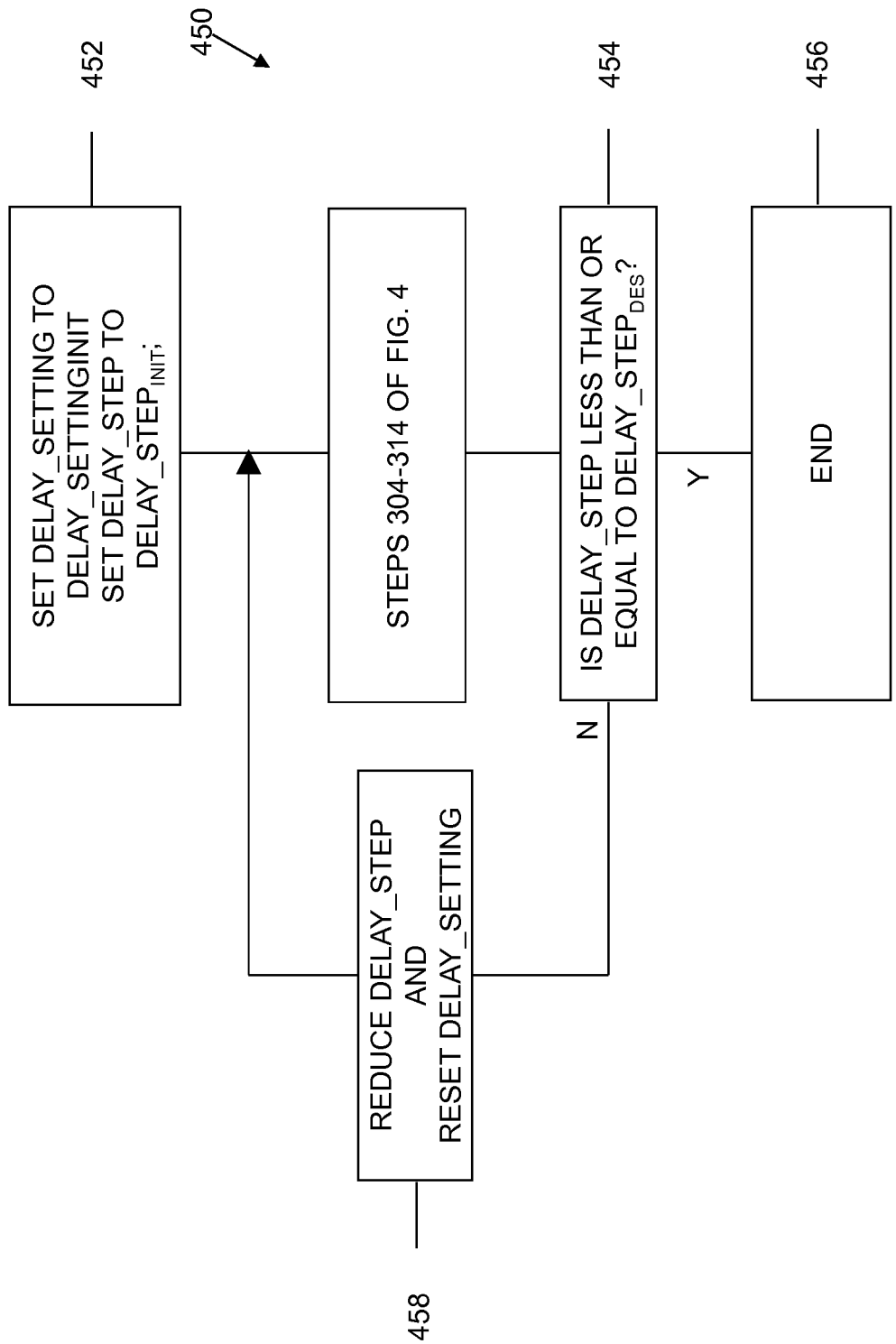
FIG. 6 illustrates a coarse-to-fine method for determining an adjustment factor for a read strobe signal.

FIG. 6 illustrates the multiscale, coarse-to-fine mechanism for determining the adjustment factor in accordance with certain embodiments. In step 452, auto calibration circuit 108 can set the delay setting, DELAY_SETTING, to an initial delay setting value, $DELAY\_SETTING_{INIT}$, and the delay step, DELAY_STEP (i.e., the delay setting increment), to an initial delay step, $DELAY\_STEP_{INIT}$.

In some embodiments, the initial delay setting value and the initial delay step can be selected based on the range of interested delay settings to be tested for the adjustment factor. For example, if the interested delay settings include delay settings between 1 and 15, then the initial delay setting value can be 1 and the initial delay step can be set to a $\frac{1}{3}^{rd}$ of the desired range of delay settings, i.e., 5. Subsequently, auto calibration circuit 108 can use these parameters to cycle through the steps 304-314 to determine a coarse adjustment factor.

In step 454, auto calibration circuit 108 determines whether the determined adjustment factor is fine-tuned to the desired accuracy (i.e., the desired resolution). The accuracy of the determined adjustment factor depends on DELAY_STEP used in steps 304-314. If DELAY_STEP was small, then the accuracy of the determined adjustment factor would be high; if DELAY_STEP was large, then the accuracy of the determined adjustment factor would be low. Therefore, auto calibration circuit 108 can determine whether the determined adjustment factor is fine-tuned to the desired accuracy by determining whether the current delay step, DELAY_STEP, is less than or equal to the desired delay step, $DELAY\_STEP_{DES}$, that results in the desired accuracy. If so, then the adjustment factor has the desired accuracy, so in step 456, auto calibration circuit 108 can terminate the adjustment factor determination. If not, then auto calibration circuit 108 goes to step 458. In step 458, auto calibration circuit 108 can reduce the delay step and initiate steps 304-314 in the vicinity of the coarse adjustment factor. The delay step can be reduced by a fixed amount or by a variable amount. The variable amount can depend on the value of the coarse adjustment factor. The current delay setting can be reset to be the smallest value within the vicinity of the coarse adjustment factor.

Figure 7:
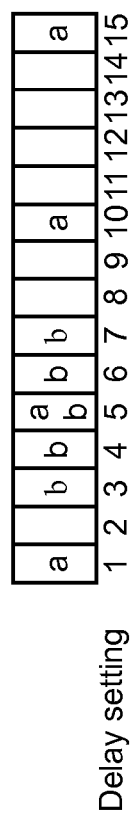
FIG. 7 illustrates an example of using the coarse-to-fine method for determining an adjustment factor.

FIG. 7 illustrates a sequence of tested delay settings in an exemplary embodiment during the coarse-to-fine adjustment factor determination mechanism. Suppose that the range of interested delay settings include 1 and 15. In step 452, auto calibration circuit 108 can set the initial delay setting value to 1 and the initial delay step to 5. In addition, auto calibration circuit 108 can set the desired delay step (i.e., the delay step that results in the desired accuracy of the adjustment factor) to 1. Under this configuration, the method steps 304-314 would test delay settings 1, 5, 10, and 15, indicated in FIG. 7 with "a."

Suppose that auto calibration circuit 108 selects the delay setting "5" as the adjustment factor. In step 454, auto calibration circuit 108 determines whether the current delay step is less than or equal to the desired delay step. Since the current delay step is 5 and the desired delay step is 1, auto calibration circuit 108 goes on to step 458. In step 458, auto calibration circuit 108 resets the current delay setting and reduces the delay step. In some embodiments, auto calibration circuit 108 resets the current delay setting to "Coarse Adjustment Factor−floor(($\frac{1}{2}$)×$DELAY\_STEP_{PREV}$)", where $DELAY\_STEP_{PREV}$ indicates the delay step used to compute the coarse adjustment factor. In this example, auto calibration circuit 108 resets the current delay setting to 3 and sets the delay step to 1, matching the desired delay step.

Subsequently, auto calibration circuit 108 cycles through steps 304-314 with the updated delay step and the updated delay setting. In this second iteration, auto calibration circuit 108 would test delay settings 3, 4, 5, 6, and 7, indicated in FIG. 7 with "b." In certain embodiments, auto calibration circuit 108 can skip testing previously tested delay settings (i.e., delay setting 5) since the catch rates associated with the previously tested delay settings are already available. This example illustrates that auto calibration circuit 108 can compute the adjustment factor with a desired accuracy without testing all the delay settings at the desired accuracy.

Figure 8:
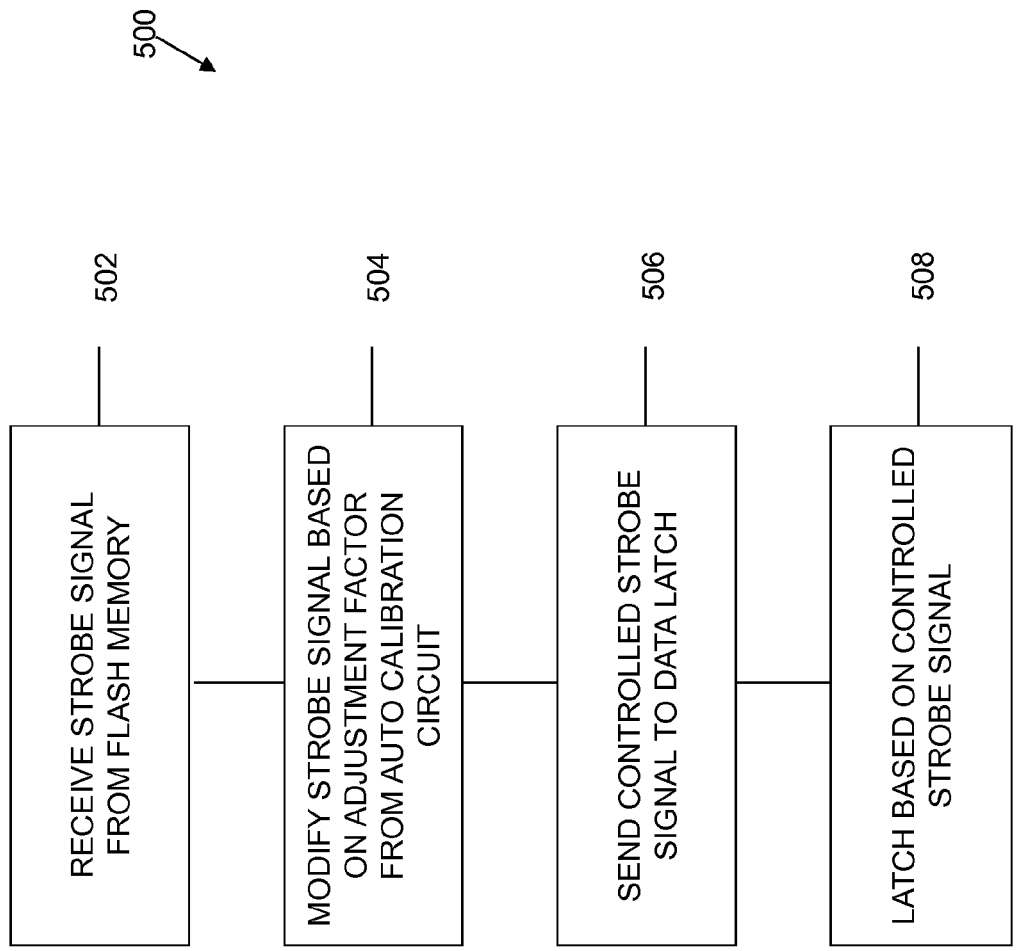
FIG. 8 illustrates a method for calibrating data read from a flash memory.

Once the adjustment factor is determined, auto calibration circuit 108 can instruct the controllable delay circuit 104 to provide the determined adjustment factor to read strobe signals during memory read operations. FIG. 8 illustrates a method of using an adjustment factor to sample a read data signal in accordance with certain embodiments. In step 502, controllable delay circuit 104 receives read strobe signal 112 from flash memory 110. In step 504, controllable delay circuit 104 modifies the phase and/or periodicity of read strobe signal 112 based on an adjustment factor provided by auto calibration circuit 108. The modified read strobe signal is referred to as controlled read strobe signal 114. In step 506, controllable delay circuit 104 sends controlled read strobe signal 114 to data latch 106. In step 508, data latch 106 latches the read data signal 116 using controlled read strobe signal 114.

By determining an adequate adjustment factor of read strobe signals, disclosed methods and systems can compensate for relative delay and/or periodicity variations of read strobe signals and read data signals. In certain embodiments, auto calibration circuit 108 can perform the disclosed methods upon initialization of the memory device. In particular, upon initialization, auto calibration circuit 108 can adjust the phase (i.e., delay) of the read strobe signal to compensate for process variations. In some embodiments, auto calibration circuit 108 can perform the disclosed methods during normal operation of the memory device. For example, auto calibration circuit 108 can adjust the phase and periodicity of the read strobe signal to compensate for temperature variations or voltage variations. In some embodiments, auto calibration circuit 108 can periodically perform the disclosed methods to compensate for time-dependent variations such as temperature variations and voltage variations.

In some embodiments, auto calibration circuit 108 can be disabled. For example, flash memory controller 110 can send a disable signal to auto calibration circuit 108. In some embodiments, flash memory controller 110 can receive a memory data request while auto calibration circuit 108 is determining the adjustment factor for the read strobe signal. In this case, flash memory controller 110 can appropriately schedule the two competing tasks: serving the memory data request and determining the adjustment factor. In certain embodiments, flash memory controller 110 can queue the memory data request and wait until auto calibration circuit 108 finishes determining the adjustment factor for the read strobe signal. In this case, once the adjustment factor has been determined, flash memory controller 110 can serve the memory data request. In other embodiments, flash memory controller 110 can disable auto calibration circuit 108 and serve the memory data request first. Once flash memory controller 110 finishes serving the memory data request, flash memory controller 110 can trigger auto calibration circuit 108 to resume determining the adjustment factor. This feature can be particularly useful for testing the memory system, for designing a memory system with small latency, and for handling exceptions that benefit from having an immediate memory access.

The disclosed subject matter can be implemented in hardware, software, firmware, or a combination of two or more of hardware, software, and firmware. An implementation of the disclosed subject matter can be realized in a centralized fashion in one computer system, or in a distributed fashion where different elements are spread across several interconnected computer systems. Any kind of computer system, or other apparatus adapted for carrying out the methods described herein, is suited to perform the functions described herein.

A typical combination of hardware and software could be a general purpose computer system with a computer program that, when being loaded and executed, controls the computer system such that it carries out the methods described herein. The disclosed subject matter can also be embedded in a computer program product, which comprises all the features enabling the implementation of the methods and systems described herein, and which, when loaded in a computer system is able to carry out these methods.

Computer program or application in the disclosed subject matter includes any expression, in any language, code or notation, of a set of instructions intended to cause a system having an information processing capability to perform a particular function either directly or after either or both of the following a) conversion to another language, code or notation; b) reproduction in a different material form. Significantly, the disclosed subject matter can be embodied in other specific forms without departing from the spirit or essential attributes thereof.

While there have been shown and described examples of the disclosed subject matter, it will be readily apparent to those skilled in the art that various changes and modifications may be made therein without departing from the scope of the disclosed subject matter.

I claim:

1. A system comprising:
a controllable delay circuit configured to receive a read strobe signal from a flash memory device and to delay the read strobe signal;
a data latch, coupled to the controllable delay circuit, configured to receive the delayed read strobe signal, and to capture data from the flash memory device using the delayed read strobe signal; and
a calibration circuit coupled to the controllable delay circuit, configured to:
instruct the controllable delay circuit to delay the read strobe signal at one of a plurality of delay settings,
receive data captured at the data latch using the read strobe signal delayed at the one of the plurality of delay settings,
select an adjustment factor from the plurality of delay settings, based on an accuracy of the data captured at the data latch, using a multi-scale approach, for delaying the read strobe signal, wherein the multi-scale approach is designed to determine the adjustment factor iteratively by, at each iteration, fine-tuning an intermediate adjustment factor determined at a previous iteration, and
instruct the controllable delay circuit to delay the read strobe signal by the adjustment factor so that the data latch captures sufficiently accurate data during subsequent memory read operations.

2. The system of claim 1, wherein the calibration circuit is configured to select the adjustment factor from the plurality of delay settings by
identifying a first plurality of delay settings from the plurality of delay settings,
selecting an intermediate adjustment factor from the first plurality of delay settings for the controllable delay circuit, based on an accuracy of the data captured at the data latch, determining a second plurality of delay settings based on the intermediate adjustment factor,
instructing the controllable delay circuit to delay the read strobe signal at one of the second plurality of delay settings, and
selecting the adjustment factor for the controllable delay circuit from the second plurality of delay settings based on data captured at the data latch using the read strobe signal delayed at the one of the second plurality of delay settings.

3. The system of claim 2, wherein the calibration circuit is configured to determine the second plurality of delay settings by selecting delay settings around the intermediate adjustment factor.

4. The system of claim 2, wherein a minimum difference between any two of the first plurality of delay settings is greater than a minimum difference between any two of the second plurality of delay settings.

5. The system of claim 1, wherein the calibration circuit is configured to determine the accuracy of the data captured at the data latch by comparing the data captured at the data latch to the data stored at the flash memory device.

6. The system of claim 1, wherein the calibration circuit is configured to determine that two of the plurality of delay settings provide a substantially similar accuracy of the captured data at the data latch, and in response to the determination, the calibration circuit is further configured to select as the adjustment factor one of the two delay settings associated with a smaller amount of delay.

7. The system of claim 1, wherein the read strobe signal is a repeating signal.

8. The system of claim 7, wherein the calibration circuit is configured to receive the data captured over multiple periods of the read strobe signal, and to count a number of times the captured data matches the data in the flash memory device.

9. A computer program product tangibly embodied in a non-transitory computer-readable storage medium, the computer program product including instructions operable to cause a data processing apparatus to:
instruct a controllable delay circuit to delay a read strobe signal, received from a flash memory device, at one of a plurality of delay settings;
receive data captured at a data latch, coupled to the controllable delay circuit, using the read strobe signal delayed at the one of the plurality of delay settings;
select an adjustment factor from the plurality of delay settings using a multi-scale approach, based on an accuracy of the data captured at the data latch, wherein the multi-scale approach is designed to determine the adjustment factor iteratively by, at each iteration, fine-tuning an intermediate adjustment factor determined at a previous iteration, and instruct the controllable delay circuit to delay the read strobe signal by the adjustment factor so that the data latch captures sufficiently accurate data during subsequent memory read operations.

10. The computer program product of claim 9, wherein the data from the flash memory device comprises at least one bit, and the read strobe signal comprises a repeating signal.

11. The computer program product of claim 9, wherein instructions operable to cause the data processing apparatus to select the adjustment factor from the plurality of delay settings comprises instructions operable to cause the data processing apparatus to:

identify a first plurality of delay settings from the plurality of delay settings, select an intermediate adjustment factor from the first plurality of delay settings for the controllable delay circuit, based on an accuracy of the data captured at the data latch using the read strobe signal delayed at the one of the first plurality of delay settings, determine a second plurality of delay settings based on the intermediate adjustment factor, and select the adjustment factor for the controllable delay circuit from the second plurality of delay settings based on data captured at the data latch using the read strobe signal delayed at the one of the second plurality of delay settings.

12. The computer program product of claim 11, wherein instructions operable to cause the data processing apparatus to determine the second plurality of delay settings comprises instructions operable to cause the data processing apparatus to select at least two of the plurality of delay settings around the intermediate adjustment factor.

13. The computer program product of claim 11, wherein a minimum difference between any two of the first plurality of delay settings is greater than a minimum difference between any two of the second plurality of delay settings.

14. The computer program product of claim 9, further comprising instructions operable to cause the data processing apparatus to:

determine that two of the plurality of delay settings provide a substantially similar accuracy of the captured data at the data latch, and in response to the determination, select as the adjustment factor one of the two delay settings associated with a smaller amount of delay.

15. A method comprising:

instructing a controllable delay circuit to delay a read strobe signal, received from a flash memory device, at one of a plurality of delay settings;

receiving data captured at a data latch, coupled to the controllable delay circuit, using the read strobe signal delayed by the controllable delay circuit at the one of the plurality of delay settings;

selecting an adjustment factor from the plurality of delay settings using a multi-scale approach, based on an accuracy of the data captured at the data latch, wherein the multi-scale approach is designed to determine the adjustment factor iteratively by, at each iteration, fine-tuning an intermediate adjustment factor determined at a previous iteration; and instructing the controllable delay circuit to delay the read strobe signal by the adjustment factor so that the data latch captures sufficiently accurate data during subsequent memory read operations.

16. The method of claim 15, wherein selecting the adjustment factor from the plurality of delay settings comprises:

identifying a first plurality of delay settings from the plurality of delay settings;

selecting an intermediate adjustment factor from the first plurality of delay settings for the controllable delay circuit, based on an accuracy of the data captured at the data latch using the read strobe signal delayed at the one of the first plurality of delay settings;

determining a second plurality of delay settings based on the intermediate adjustment factor; and selecting the adjustment factor for the controllable delay circuit from the second plurality of delay settings based on data captured at the data latch using the read strobe signal delayed at the one of the second plurality of delay settings.

17. The method of claim 16, wherein a minimum difference between any two of the first plurality of delay settings is greater than a minimum difference between any two of the second plurality of delay settings.

18. The method of claim 16, wherein determining the second plurality of delay settings comprises selecting at least two of the plurality of delay settings around the intermediate adjustment factor.

19. The method of claim 15, further comprising:

determining that two of the plurality of delay settings provide a substantially similar accuracy of the captured data at the data latch; and in response to the determination, selecting as the adjustment factor one of the two delay settings associated with a smaller amount of delay.

20. The method of claim 15, wherein the read strobe signal includes a repeating signal.

* * * * *